United States Patent
Kim et al.

(10) Patent No.: US 7,740,738 B2
(45) Date of Patent: Jun. 22, 2010

(54) INDUCTIVELY COUPLED ANTENNA AND PLASMA PROCESSING APPARATUS USING THE SAME

(75) Inventors: Tae-wan Kim, Yongin (KR); Yuri Nikolaevich Tolmachev, Suwon (KR); Dong-joon Ma, Anyang (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 641 days.

(21) Appl. No.: 10/748,277

(22) Filed: Dec. 31, 2003

(65) Prior Publication Data

US 2004/0149387 A1 Aug. 5, 2004

(30) Foreign Application Priority Data

Jan. 3, 2003 (KR) .................... 10-2003-0000380

(51) Int. Cl.
*C23C 16/00* (2006.01)
*H01L 21/306* (2006.01)

(52) U.S. Cl. ............................. 156/345.48; 118/723 I; 118/723 AN

(58) Field of Classification Search .............. 118/723 I, 118/723 IR, 723 AN; 156/345.48, 345.49; 315/111.51
See application file for complete search history.

(56) References Cited

U.S. PATENT DOCUMENTS

| | | | |
|---|---|---|---|
| 5,346,578 A * | 9/1994 | Benzing et al. ........ | 156/345.48 |
| 5,405,480 A | 4/1995 | Benzing et al. | |
| 5,531,834 A * | 7/1996 | Ishizuka et al. .......... | 118/723 I |
| 5,540,800 A | 7/1996 | Qian | |
| 5,540,824 A | 7/1996 | Yin et al. | |
| 5,560,776 A * | 10/1996 | Sugai et al. ........... | 118/723 AN |
| 5,681,393 A | 10/1997 | Takagi | |
| 5,795,429 A | 8/1998 | Ishii et al. | |
| 6,056,848 A | 5/2000 | Daviet | |
| 6,164,241 A | 12/2000 | Chen et al. | |
| 6,204,604 B1 | 3/2001 | Donohoe | |
| 6,225,744 B1 | 5/2001 | Tobin et al. | |
| 6,288,493 B1 | 9/2001 | Lee et al. | |
| 6,451,161 B1 | 9/2002 | Jeng et al. | |
| 6,527,912 B2 | 3/2003 | Chen et al. | |
| 6,531,029 B1 | 3/2003 | Ni et al. | |
| 2002/0018025 A1 | 2/2002 | Matsuda et al. | |
| 2002/0140359 A1* | 10/2002 | Chen et al. ............. | 315/111.21 |

(Continued)

FOREIGN PATENT DOCUMENTS

JP 54-008441 1/1979

(Continued)

*Primary Examiner*—Luz L. Alejandro
(74) *Attorney, Agent, or Firm*—Lee & Morse, P.C.

(57) ABSTRACT

An inductively coupled antenna for installation on a reaction chamber of an inductively coupled plasma (ICP) processing apparatus and for connection to a radio frequency (RF) power source to induce an electric field for ionizing a reactant gas injected into the reaction chamber and for generating plasma includes a coil having a plurality of turns including an outermost turn and a plurality of inner turns, wherein a current flowing through the outermost turn is larger than a current flowing through the plurality of inner turns. The outermost turn and the inner turns are connected to the RF power supply in parallel and the inner turns are connected to each other in series. The inductively coupled antenna further includes a conductive metal tube that has a cooling path and a conductive metal strip that is electrically and thermally connected to a lower portion of the metal tube.

20 Claims, 4 Drawing Sheets

U.S. PATENT DOCUMENTS

2003/0106645 A1 * 6/2003 Ni et al. .................. 156/345.48

FOREIGN PATENT DOCUMENTS

| | | |
|---|---|---|
| JP | 06-267903 A | 9/1994 |
| JP | 07-078698 A | 3/1995 |
| JP | 07-263188 A | 10/1995 |
| JP | 07-326494 A | 12/1995 |
| JP | 08-203695 A | 8/1996 |
| JP | 09-232282 A | 9/1997 |
| JP | 2001-085196 A | 3/2001 |
| JP | 2002-008996 A | 1/2002 |
| JP | 2002-519861 T | 7/2002 |
| JP | 2004-520704 T | 7/2004 |
| JP | 2004-532504 T | 10/2004 |
| WO | WO-0000993 * | 1/2000 |

* cited by examiner

INDUCTIVELY COUPLED ANTENNA AND PLASMA PROCESSING APPARATUS USING THE SAME

BACKGROUND OF THE INVENTION

1. Field of the Invention

The present invention relates to an inductively coupled plasma processing apparatus. More particularly, the present invention relates to an inductively coupled antenna having a structure for improving plasma uniformity, and a plasma processing apparatus using the same.

2. Description of the Related Art

Recently, plasma techniques have been widely used in fine processing of substrates during the fabrication of semiconductor devices or flat display panels. In those techniques, plasma is used to etch or deposit predetermined material layers on the surfaces of wafers for fabricating semiconductor devices or on the surfaces of substrates for fabricating liquid crystal displays (LCD). In particular, plasma processing apparatuses have been increasingly used to etch or deposit thin layers on substrates for fabricating highly integrated semiconductor devices.

Examples of plasma processing apparatuses used when fabricating semiconductor devices include capacitive coupled plasma (CCP) processing apparatus, electron cyclotron resonance (ECR) processing apparatuses, helicon processing apparatuses, and inductively coupled plasma (ICP) processing apparatuses. The ICP processing apparatus has advantages of a simplified structure and ease in obtaining plasma of high density and uniformity. Thus, the ICP processing apparatus is most widely used currently.

FIG. 1 illustrates a sectional view of a structure of a conventional ICP processing apparatus. Referring to FIG. 1, a conventional ICP processing apparatus includes a reaction chamber 10 having a plasma forming space therein. An electrostatic chuck 12 for supporting a substrate, for example, a wafer W, is arranged in a lower portion of the reaction chamber 10. A dielectric window 16 is installed in an upper cover 11 of the reaction chamber 10. A gas injection port 14 for injecting a reactant gas into the reaction chamber 10 is formed on a sidewall of the reaction chamber 10. A plurality of gas distribution ports 15, which is connected to the gas injection port 14, is formed in the reaction chamber 10. A vacuum suction port 18 connecting a vacuum pump 19 is formed on a bottom of the reaction chamber 10 for evacuating the inside of the reaction chamber 10 through the vacuum suction port 18. In addition, an antenna 20 for generating plasma in the reaction chamber 10 is installed on the dielectric window 16.

A radio frequency (RF) power supply (not shown) is connected to the antenna 20 to generate RF current through the antenna 20. A magnetic field is created by the RF current that flows through the antenna 20, and an electric field is induced in the reaction chamber 10 by changes in the magnetic field as a function of time. At the same time, the reactant gas is injected into the reaction chamber 10 via the gas distribution ports 15. In this case, electrons excited by the inducted electric field ionize the reactant gas to generate plasma in the reaction chamber 10. The plasma chemically reacts with the surface of the wafer W to perform a desired process, for example, an etching process, on the wafer W. Alternatively, another RF power supply (not shown) is generally connected to the electrostatic chuck 12 in order to supply a bias voltage for increasing the energy of ions that are withdrawn from the plasma and collide against the wafer W.

FIG. 2 illustrates a perspective view of an example of the conventional antenna shown in FIG. 1. As shown in FIG. 2, the general inductively coupled antenna 20 is formed of a conductive coil with a spiral shape.

When the conventional inductively coupled antenna 20 is used, however, the density distribution of the plasma is not uniform in the reaction chamber 10 because the strength of the electric field that is induced by the antenna 20 varies with location. More specifically, the induced electric field is strong at a center portion of the antenna 20 and weak at an edge portion of the antenna 20. Accordingly, the density of the plasma is low at the edge portion of the reaction chamber 10. When the density distribution of the plasma is nonuniform, the depth to which the wafer W is etched or the thickness to which the material layer is deposited on the wafer W is similarly nonuniform. In particular, as a size of the ICP processing apparatus increases, a diameter of the reaction chamber 10 increases, and the uniformity of the plasma density significantly decreases.

As described above, when developing an ICP processing apparatus, it is important to consider the need to maintain a uniform plasma distribution and high-density, as the size of a substrate increases. In addition to the development of a high-density plasma source, the antenna that is the base of an ICP discharge should be designed to improve RF power efficiency and plasma distribution uniformity while reducing damage to the substrate.

However, the above-requirements adversely affect each other. When the RF power is increased, a voltage across the antenna is increased. In addition, in order to maintain high plasma density in a large ICP processing apparatus, the antenna coil should have a large radius and large number of turns. Accordingly, the self-inductance of the antenna is increased so that the voltage across the antenna is increased. When the voltage across the antenna is increased, capacitive coupling easily occurs. Such capacitive coupling excessively increases the kinetic energy of ions, so it is difficult to precisely control the processes. In addition, ions having high kinetic energy strongly collide against the inner walls of the reaction chamber and create particles or collide against the substrate and damage the substrate. Furthermore, when capacitive coupling occurs, RF power efficiency deteriorates.

Accordingly, conventional antennas cannot ensure a uniform distribution of plasma in response to changes in process conditions. In particular, as the size of wafers increases, it becomes more difficult to maintain a uniform distribution of plasma at the edge portion of the wafer using conventional antennas. Accordingly, the quality and yield of semiconductor devices deteriorate.

SUMMARY OF THE INVENTION

The present invention provides an inductively coupled antenna having a structure for improving plasma uniformity and reducing capacitive coupling, power loss, and damage to a substrate, and a plasma processing apparatus using the same.

It is therefore a feature of an embodiment of the present invention to provide an inductively coupled antenna for installation on a reaction chamber of an inductively coupled plasma (ICP) processing apparatus and for connection to a radio frequency (RF) power source to induce an electric field for ionizing a reactant gas injected into the reaction chamber and for generating plasma, the inductively coupled antenna including a coil having a plurality of turns including an outermost turn and a plurality of inner turns, wherein a current flowing through the outermost turn is larger than a current flowing through the plurality of inner turns.

It is another feature of an embodiment of the present invention to provide an ICP processing apparatus including a reaction chamber maintained in a vacuum state, an antenna installed on the reaction chamber to induce an electric field for ionizing a reactant gas injected into the reaction chamber and for generating plasma, and a RF power source that is connected to the antenna to supply RF power, wherein the antenna is formed of a coil having a plurality of turns, including an outermost turn and a plurality of inner turns, and wherein a current flowing through the outermost turn is larger than a current flowing through the plurality of inner turns.

Preferably, the outermost turn and one of the plurality of inner turns are connected to the RF power supply in parallel and the plurality of inner turns are connected to each other in series.

Preferably, a sum of lengths of the plurality of inner turns is longer than a length of the outermost turn.

Preferably, the plurality of turns is formed of a single conductive line and is concentrically formed.

Preferably, the ICP antenna further includes a conductive metal tube having a cooling path and a conductive metal strip that is electrically and thermally connected to a lower portion of the conductive metal tube. Preferably, the conductive metal tube is formed of copper. Preferably, the conductive metal tube has a circular cross-section and the conductive metal strip has tall and narrow rectangular cross-section.

In one embodiment of the present invention, a height of the metal strip gradually decreases from a center portion to an edge portion of the antenna.

Accordingly, in an inductively coupled antenna according to an embodiment of the present invention plasma uniformity is improved, and capacitive coupling, RF power loss, and damages to a substrate are reduced.

BRIEF DESCRIPTION OF THE DRAWINGS

The above and other features and advantages of the present invention will become more apparent to those of ordinary skill in the art by describing in detail preferred embodiments thereof with reference to the attached drawings in which.

DETAILED DESCRIPTION OF THE INVENTION

Figure 1:
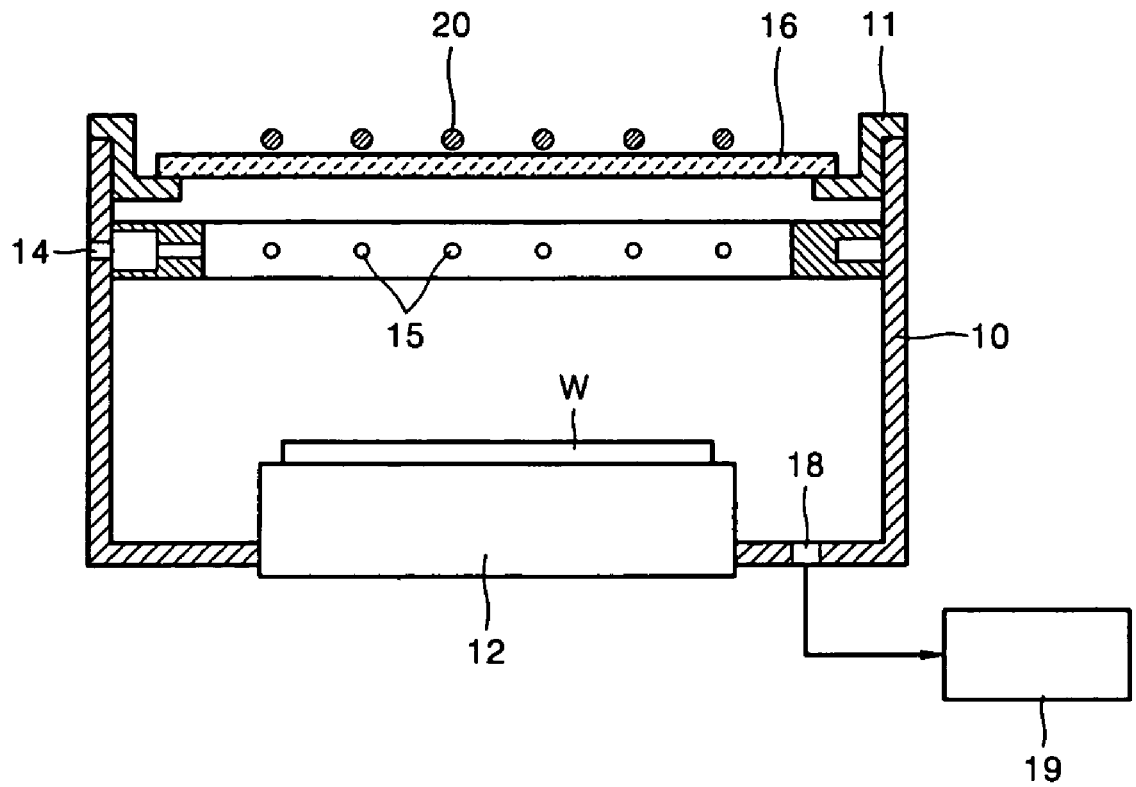
FIG. 1 illustrates a sectional view of a structure of a conventional inductively coupled plasma (ICP) processing apparatus.
Figure 2:
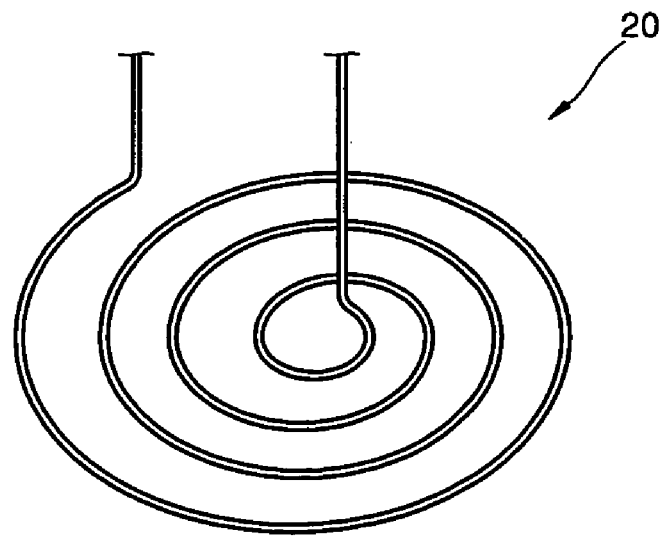
FIG. 2 illustrates a perspective view of an example of a conventional antenna shown in FIG. 1.

Korean Patent Application No. 2003-380, filed on Jan. 3, 2003, and entitled: "Inductively Coupled Antenna and Plasma Processing Apparatus Using the Same," is incorporated by reference herein in its entirety.

The present invention will now be described more fully hereinafter with reference to the accompanying drawings, in which preferred embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

Figure 3:
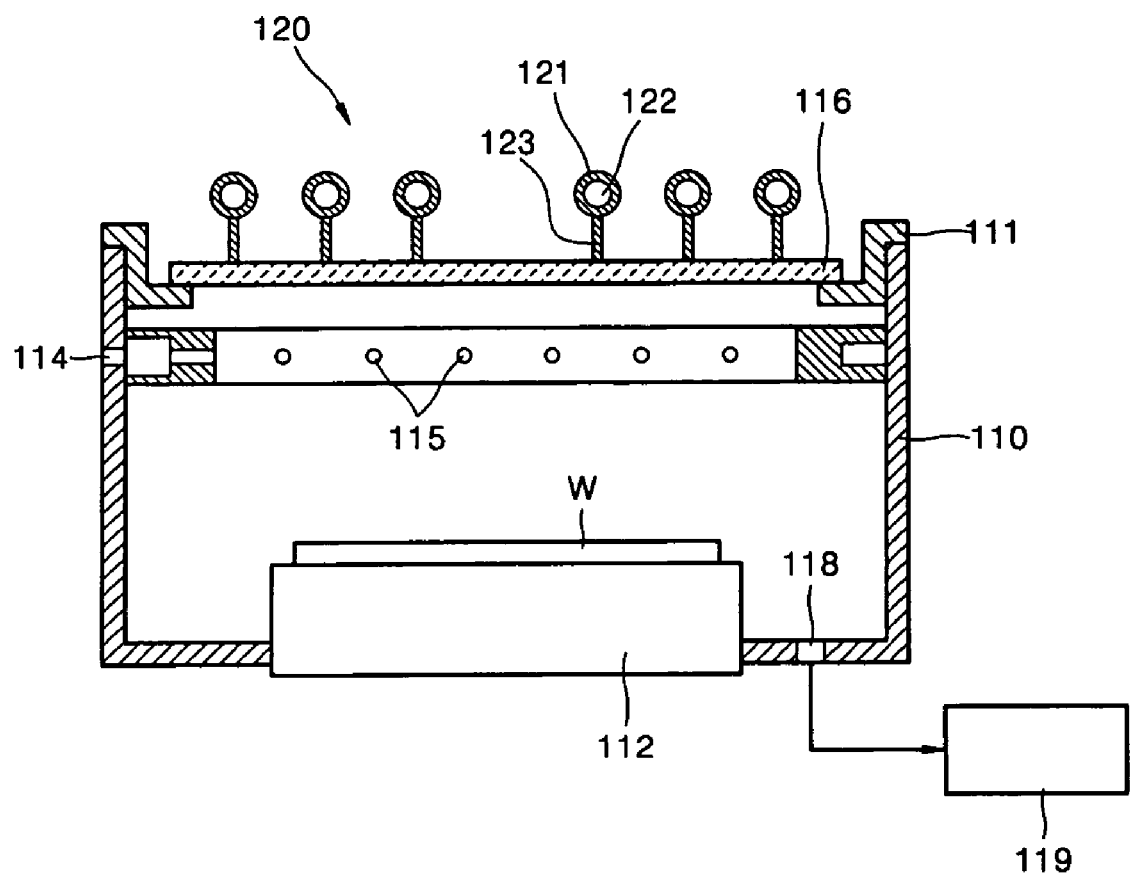
FIG. 3 illustrates a sectional view of a structure of an ICP processing apparatus having an antenna according to a first embodiment of the present invention.
Figure 4:
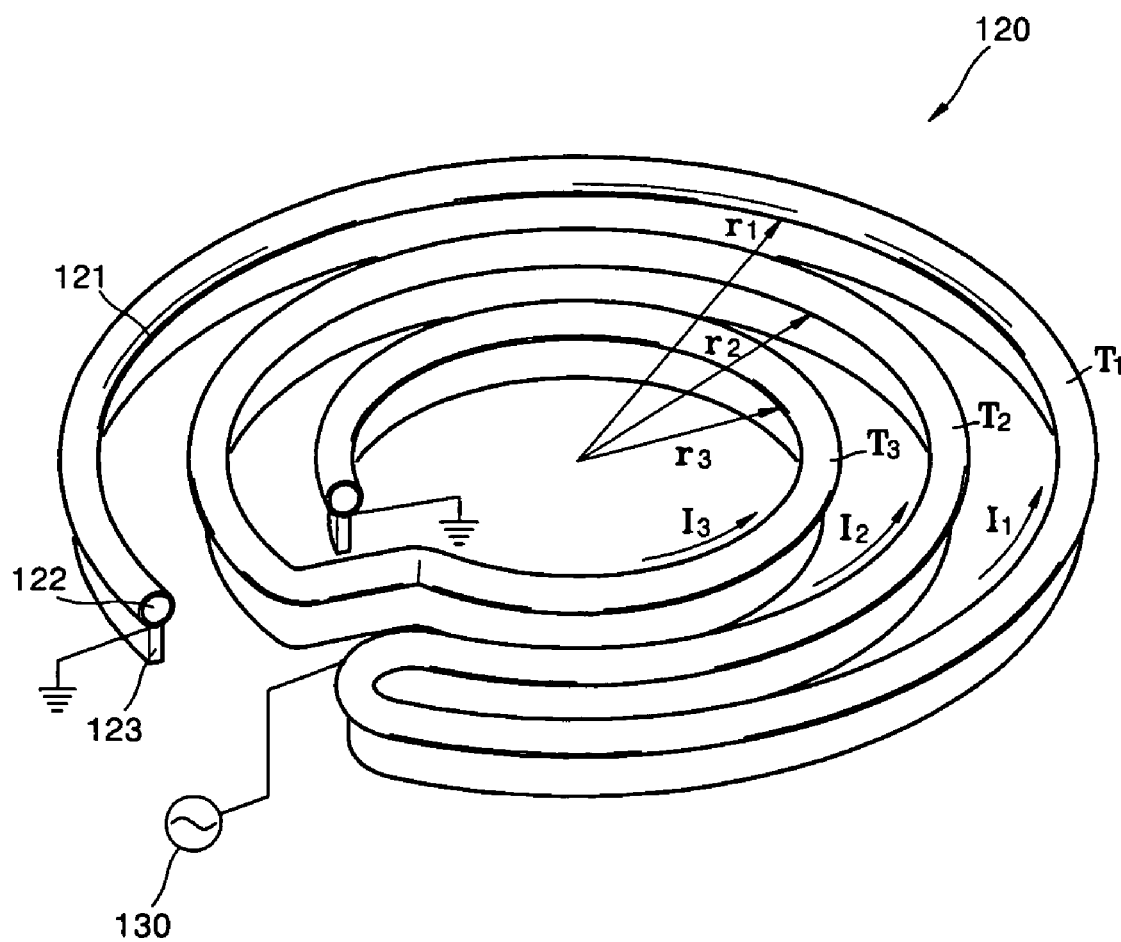
FIG. 4 illustrates a perspective view of an antenna shown in FIG. 3.

FIG. 3 illustrates a sectional view of a structure of an inductively coupled plasma (ICP) processing apparatus having an antenna according to a first embodiment of the present invention. FIG. 4 illustrates a perspective view of the antenna shown in FIG. 3.

Referring to FIGS. 3 and 4, an ICP processing apparatus according to a first embodiment of the present invention is used to perform fine processes. These fine processes include etching the surfaces of semiconductor device substrates, for example, wafers W, or depositing predetermined material layers on the surfaces of the wafers W, using plasma that is generated by an antenna 120.

The ICP processing apparatus includes a reaction chamber 110 having a plasma forming space therein. The inside of the reaction chamber 110 is maintained in a vacuum state using a vacuum suction port 118 that is formed on a bottom of the reaction chamber and connected to a vacuum pump 119. An electrostatic chuck 112 for supporting a substrate, for example, a wafer W, is formed in a lower portion of the reaction chamber 110, and a power supply (not shown) is connected to the electrostatic chuck 112. In operation, a bias voltage is supplied to the electrostatic chuck 112 in order for ions that are withdrawn from the plasma generated in the reaction chamber 110 to collide against the surface of the wafer W with a high energy. A dielectric window 116 is installed on an upper cover 111 of the reaction chamber 110 in order to transmit the RF power. A gas injection port 114 for injecting a reactant gas into the reaction chamber 110 is formed on a sidewall of the reaction chamber 110. A plurality of gas distribution ports 115 connected to the gas injection port 114 is arranged in the reaction chamber 110.

An antenna 120 is installed at an upper portion of the reaction chamber 110, i.e., on the dielectric window 116, in order to induce an electric field that ionizes the reactant gas injected into the reaction chamber 110 and generates plasma. An RF power supply 130 is connected to the antenna 120. Thus, when RF current flows through the antenna 120, a magnetic field is generated according to Ampere's right-hand rule. Subsequently, an electric field is induced in the reaction chamber 110 according to change in the magnetic field as a function of time. The induced electric field excites electrons, and the electrons ionize the reactant gas injected into the reaction chamber 110 via the gas distribution ports 115, thereby generating plasma.

The antenna 120 according to an embodiment of the present invention is formed of a coil with a plurality of turns. In the embodiment of the present invention shown in FIG. 4, the antenna 120 has three turns, however, the number of turns may be varied. Hereinafter, an exemplary antenna 120 having three turns $T_1$, $T_2$, and $T_3$ will be described.

In the antenna 120 according to an embodiment of the present invention, the current flowing through the outermost first turn $T_1$ is higher than the current flowing through the inner second and third turns $T_2$ and $T_3$.

More specifically, the outermost first turn $T_1$ of the antenna 120 is electrically connected in parallel with each of the inner turns $T_2$ and $T_3$. The second turn $T_2$ and the third turn $T_3$ are electrically connected in series. The RF power supply 130 is connected to a branch point of the first turn $T_1$ and the second turn $T_2$. In addition, the first turn $T_1$ is wound in a circle and an end of the first turn $T_1$ is grounded. The second turn $T_2$ is wound in the same direction as the first turn $T_1$ and an end of the second turn $T_2$ is connected to the third turn $T_3$ in series. The third turn $T_3$ is connected to the second turn $T_2$ in series and wound in the same direction as the second turn $T_2$. In addition, an end of the third turn $T_3$ is grounded. The turns $T_1$, $T_2$, and $T_3$ are concentrically formed.

The sum of the lengths of the inner turns, i.e., the second and third turns $T_2$ and $T_3$, is longer than the length of the outermost turn, i.e., the first turn $T_1$. Accordingly, when the cross-sectional areas of the turns $T_1$, $T_2$, and $T_3$ are the same, an inductance of the first turn $T_1$ is smaller than an inductance of the second and third turns $T_2$ and $T_3$. Accordingly, a larger current flows through the first turn $T_1$ than the second and third turns $T_2$ and $T_3$.

In the present example, the radii of the first through third turns $T_1$, $T_2$, and $T_3$ are denoted by $r_1$, $r_2$, and $r_3$, respectively. The currents flowing through the first through third turns $T_1$, $T_2$, and $T_3$ are denoted by $I_1$, $I_2$, and $I_3$, respectively. In this case, the current $I_1$ in the first turn $T_1$ may be made higher than the currents $I_2$ and $I_3$ in the second and third turns $T_2$ and $T_3$ by controlling the lengths of the radii $r_1$, $r_2$, and $r_3$. When the sum of the lengths of the second and third turns $T_2$ and $T_3$ is made twice as long as the length of the first turn $T_1$, by controlling the lengths of the radii $r_1$, $r_2$, and $r_3$, the total impedance of the second and third turns $T_2$ and $T_3$ becomes twice as large as the impedance of the first turn $T_1$. In addition, based on the connected structure of the first through third turns $T_1$, $T_2$, and $T_3$, the voltage applied to the first turn $T_1$ is the same as the sum of the voltage applied to the second and third turns $T_2$ and $T_3$. Accordingly, the current $I_1$ flowing through the first turn $T_1$ becomes twice as high as the currents $I_2$ and $I_3$ flowing through the second and third turns $T_2$ and $T_3$, respectively. For example, when each of the currents $I_2$ and $I_3$ is 20 A, the current $I_1$ is 40 A.

As described above, in the antenna 120 according to the present invention, the current $I_1$ flowing through the outermost turn, i.e., the first turn $T_1$, may be controlled and increased by controlling the length of the radii $r_1$, $r_2$, and $r_3$ of the turns $T_1$, $T_2$, and $T_3$. Thus, the induced electric field at the edge portion of the reaction chamber 110 where the first turn $T_1$ of the antenna 120 is located may be enhanced so that the plasma density increases at the edge portion of the reaction chamber 110. Accordingly, plasma uniformity in the reaction chamber 110 may be improved.

In addition, it is well known that the parallel connection of the first turn $T_1$ and the second turn $T_2$ of the antenna 120 significantly reduces the self-inductance of the antenna 120. Furthermore, the parallel connection of the first turn $T_1$ and the second turn $T_2$ of the antenna 120 reduces the voltage at both parallel branches of the antenna 120 when the same RF power is applied to the antenna 120. Thus, capacitive coupling is remarkably reduced and resistive power loss is reduced so that RF power efficiency may be increased to at least 90%. In addition, the reduction of capacitive coupling reduces the potential of the plasma so that damage to the substrate may be reduced.

The first through third turns $T_1$, $T_2$, and $T_3$ may be formed of a conductive line. In other words, the antenna 120 may be formed of a single line of conductor. As a result, since separate connecting structures are not necessary to connect the three turns $T_1$, $T_2$, and $T_3$, the antenna 120 may be easily manufactured.

The antenna 120 includes a tube 121 formed of a metal having excellent conductivity and a strip 123 formed of a metal having excellent conductivity, the strip 123 being electrically and thermally connected to a lower portion of the metal tube 121. More specifically, the first through third turns $T_1$, $T_2$, and $T_3$ are formed of the metal tube 121 and the metal strip 123. A cooling path 122 is formed in the metal tube 121. Although various metals may be used as the conductive metal for the metal tube 121 and the metal strip 123, it is preferable that copper having excellent electrical and thermal conductivity and processability is used as the conductive metal. The metal tube 121 and the metal strip 123 may be firmly coupled by welding or brazing.

It is preferable that the metal tube 121 has a circular cross-section in order for cooling water to smoothly flow through the cooling path 122 that is formed in the metal tube 121. In addition, when the metal tube 121 is formed to have a circular cross-section, an increase in resistance due to an uneven distribution of current flowing along the surface of the tube 121 may be prevented.

It is preferable that the metal strip 123 has a tall and narrow rectangular cross-section. It is well known that as the sectional area of an antenna increases, the self-inductance of the antenna decreases. In addition, when the sectional area of an antenna is constant, the self-inductance of the antenna is smaller when the antenna has a tall and narrow rectangular cross-section than when the antenna has a short and wide rectangular cross-section. Thus, the antenna 120 having the metal strip 123 formed with a tall and narrow rectangular cross-section has a reduced self-inductance so that the antenna 120 has advantages as described above.

The antenna 120 may be efficiently cooled by the thermal contact between the metal tube 121 having the cooling path 122 and the metal strip 123 and by the excellent thermal conductivity of copper that forms the tube 121 and the strip 123. In addition, the antenna 120 may be firmly manufactured according to the coupling structure of the metal tube 121 and the metal strip 123 so that the antenna 120 may maintain its shape without requiring an additional support or clamp.

Figure 5:
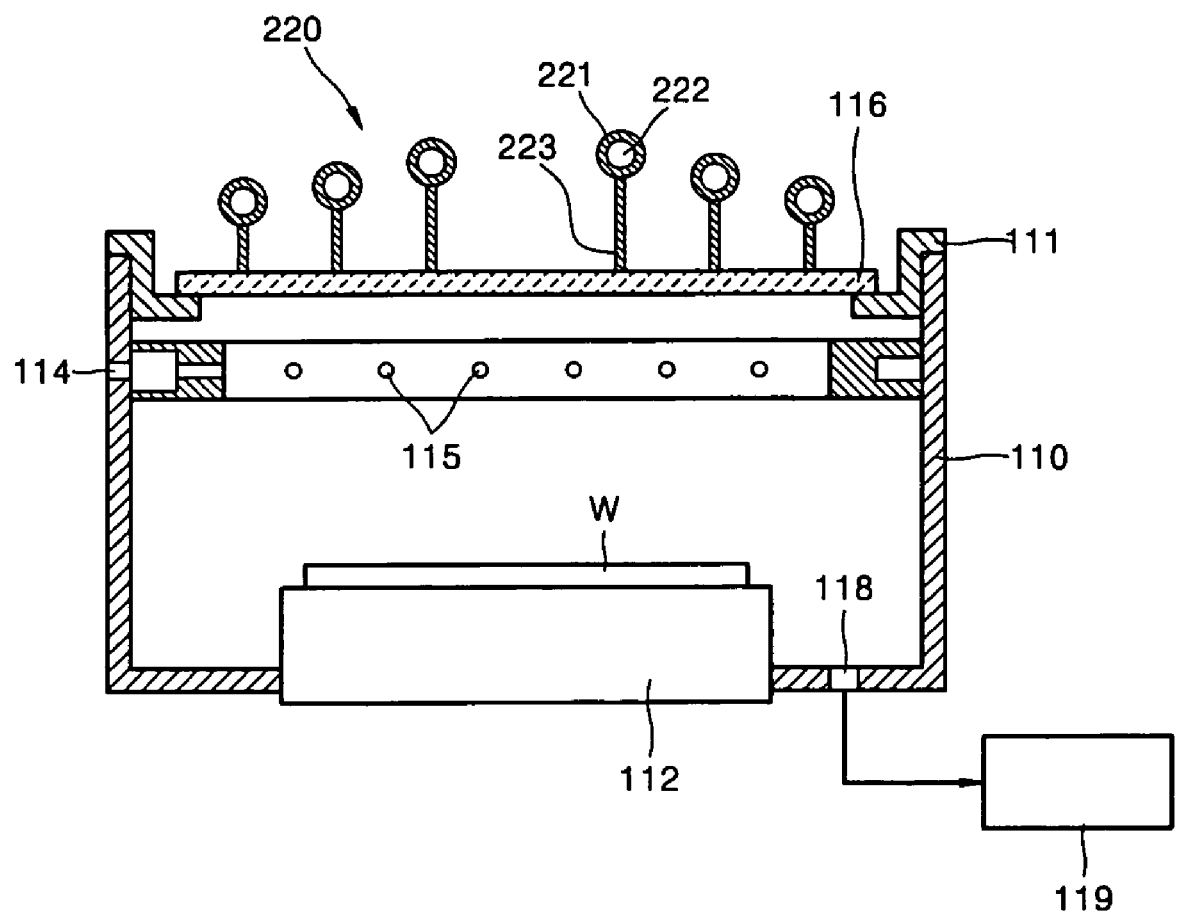
FIG. 5 illustrates a sectional view of a structure of an ICP processing apparatus having an antenna according to a second embodiment of the present invention.

FIG. 5 illustrates a sectional view of a structure of an ICP processing apparatus having an antenna according to a second embodiment of the present invention. As mentioned above, the same reference numerals used in FIG. 3 denote the same elements.

An antenna 220 according to the second embodiment of the present invention includes a conductive metal tube 221 having a cooling path 222 and a conductive metal strip 223 that is electrically and thermally connected to a lower portion of the metal tube 221. In addition, a height of the metal strip 223 gradually decreases from a center portion to an edge portion of the antenna 220. According to the structure of the antenna in the second embodiment of the present invention, the strength of an electric field induced at the edge portion of the antenna 220 is enhanced so that the density of the plasma increases at the edge portion of the antenna 220. Thus, the density distribution of plasma in the reaction chamber 110 becomes uniform.

In the case of an ICP discharge, a capacitive coupling generated by applying a high voltage to the antenna causes high plasma potential and lowers RF power efficiency and plasma uniformity. Accordingly, the antenna should be designed to improve plasma uniformity and reduce the effect of capacitive coupling. In addition, when increasing an RF frequency to obtain the plasma, which may be sustained at a low temperature while having high density and low electron temperature, an antenna having a low self-inductance is necessary. The antenna according to the embodiments of the present invention improves plasma uniformity and has a low self-inductance so that the voltage across the antenna is low even when a high RF frequency is used. As a result, capacitive coupling is reduced.

As described above, the inductively coupled antenna and the ICP processing apparatus according to the present invention have several advantages.

First, plasma uniformity in the reaction chamber may be improved by forming the antenna to have the above-described structure where a large amount of current flows through the outermost turn. In addition, the outermost turn and the inner turns of the antenna are connected in parallel to reduce the self-inductance of the antenna. Accordingly, plasma discharge using a high frequency is possible. In addition, since the voltage applied to the antenna is lowered, capacitive coupling is lowered and damage to the substrate is reduced.

Second, since the antenna is formed of the metal tube and the metal strip, it is robust and may be efficiently cooled. Thus, the shape of the antenna may be maintained without using an additional support or clamp.

Third, since the metal strip is formed with a tall and narrow rectangular cross-section, the self-inductance of the antenna may be efficiently reduced. In addition, the density distribution of the plasma in the reaction chamber may be kept uniform by changing the height of the metal strip.

Preferred embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. An inductively coupled antenna, comprising:
    a single coil having a plurality of turns including an outermost turn and a plurality of inner turns, wherein the outermost turn is connected in parallel with the plurality of inner turns and a sum of lengths of the plurality of inner turns is longer than a length of the outermost turn.

2. The inductively coupled antenna as claimed in claim 1, wherein the outermost turn and the plurality of inner turns are connected to the RF power supply at a branch point of the outermost turn and the plurality of inner turns and the plurality of inner turns are connected to each other in series.

3. The inductively coupled antenna as claimed in claim 2, wherein the branch point of the outermost turn and the plurality of inner turns corresponds to a base point of a substantially U-shaped portion of the coil.

4. The inductively coupled antenna as claimed in claim 1, wherein the plurality of turns is concentrically formed.

5. The inductively coupled antenna as claimed in claim 1, wherein the plurality of turns are part of a single continuous conductive line.

6. The inductively coupled antenna, as claimed in claim 1, wherein the coil further comprises:
    a conductive metal tube having a cooling path; and
    a conductive metal strip that is electrically and thermally connected to the conductive metal tube and is coextensive with the conductive metal tube.

7. The inductively coupled antenna as claimed in claim 6, wherein the conductive metal tube has a circular cross-section.

8. The inductively coupled antenna as claimed in claim 6, wherein the conductive metal strip has a long and narrow rectangular cross-section.

9. The inductively coupled antenna as claimed in claim 6, wherein the metal strip extends away from surface of an outer surface of the metal tube and a distance that the metal strip extends away from the outer surface of the metal tube gradually decreases from a center portion of the antenna to an end portion of the antenna.

10. The inductively coupled antenna as claimed in claim 1, wherein the outermost coil is connected in parallel to each of the plurality of inner turns.

11. An inductively coupled plasma (ICP) processing apparatus, comprising:
    a reaction chamber maintained in a vacuum state;
    an antenna installed on the reaction chamber to induce an electric field for ionizing a reactant gas injected into the reaction chamber and for generating plasma; and
    a RF power source that is connected to the antenna to supply RF power,
    wherein the antenna is formed of a single coil having a plurality of turns, including an outermost turn and a plurality of inner turns, wherein the outermost turn is connected in parallel with the plurality of inner turns and wherein a sum of lengths of the plurality of inner turns is longer than a length of the outermost turn.

12. The ICP processing apparatus as claimed in claim 11, wherein the outermost turn and the plurality of inner turns are connected to the RF power supply at a branch point of the outermost turn and the plurality of inner turns and the plurality of inner turns are connected to each other in series.

13. The ICP processing apparatus as claimed in claim 12, wherein the branch point of the outermost turn and the plurality of inner turns corresponds to a base point of a substantially U-shaped portion of the coil.

14. The ICP processing apparatus as claimed in claim 11, wherein the plurality of turns are concentrically formed.

15. The ICP processing apparatus as claimed in claim 11, wherein the plurality of turns are part of a single continuous conductive line.

16. The ICP processing apparatus as claimed in claim 11, wherein the outermost coil is connected in parallel to each of the plurality of inner turns.

17. The ICP processing apparatus as claimed in claim 11, wherein the coil further comprises:
    a conductive metal tube having a cooling path; and
    a conductive metal strip that is electrically and thermally connected to the conductive metal tube and is coextensive with the conductive metal tube.

18. The ICP processing apparatus as claimed in claim 17, wherein the conductive metal tube has a circular cross-section.

19. The ICP processing apparatus as claimed in claim 17, wherein the conductive metal strip has a long and narrow rectangular cross-section.

20. The ICP processing apparatus as claimed in claim 17, wherein a distance that the metal strip extends away from an outer surface of the antenna gradually decreases from a center portion of the antenna to an end portion of the antenna.

* * * * *